United States Patent [19]

Uebayashi et al.

[11] Patent Number: 6,134,694
[45] Date of Patent: *Oct. 17, 2000

[54] ERROR CONTROL METHOD AND ERROR CONTROL DEVICE FOR DIGITAL COMMUNICATION

[75] Inventors: Shinji Uebayashi; Hui Zhao, both of Kanagawa, Japan

[73] Assignee: NTT Mobile Communications Network, Inc., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/728,216

[22] Filed: Oct. 10, 1996

[30] Foreign Application Priority Data

Feb. 29, 1996 [JP] Japan .................................. 96-043117

[51] Int. Cl.[7] ........................ H03M 13/29; H03M 13/35; H04L 1/02; H04L 1/20

[52] U.S. Cl. .......................... 714/751; 714/758; 714/774; 714/780; 714/795

[58] Field of Search .............................. 371/37.01, 37.06, 371/35, 43.7; 714/758, 751, 780, 774, 794

[56] References Cited

U.S. PATENT DOCUMENTS 4,763,331  8/1988  Matsumoto ................................ 371/37

FOREIGN PATENT DOCUMENTS

| 52-147909 | 12/1977 | Japan . |
| 60-96938 | 5/1985 | Japan . |
| 62-136939 | 6/1987 | Japan . |
| 62-146033 | 6/1987 | Japan . |
| 62-277824 | 12/1987 | Japan . |
| 63-28146 | 2/1988 | Japan . |
| 6-85693 | 3/1994 | Japan . |
| 6-188862 | 7/1994 | Japan . |

OTHER PUBLICATIONS

Mandelbaum, D., "An Adaptive–Feedback Coding Scheme Using Incremental Redundancy", IEEE Transactions on Information Theory, May 1974, pp. 388–389.

Loeliger, H–A., "A Practical Reliability Metric for Block Codes Used on Binary–Input Channels", IEEE Transactions on Communications, vol. 38, No. 4, Apr. 1990, pp. 405–408.

Aridhi, S., et al., "Performance Analysis of Type–I and Type–II Hybrid ARQ Protocols using Concatenated Codes in a DS–CDMA Rayleigh Fading Channel", 4th International Conference on Universal Personal Communications, pp. 748–752, Dec. 1995.

Chase, D., "A Class of Algorithms for Decoding Block Codes With Channel Measurement Information", IEEE Transactions on Information Theory, vol. IT–18, No. 1, Jan. 1972, pp. 170–182.

Lugand, L., et al., "Parity Retransmission Hybrid ARQ Using Rate 1/2 Convolutional Codes on a Nonstationary Channel", IEEE Transactions on Communications, vol. 37, No. 7, Jul. 1989, pp. 755–765.

Ng., W–H., "Adaptive ARQ Using Complementary Coding and Signal Editing", MILCOM '92, pp. 589–593, Dec. 1992.

Kaneko, T., et al., "An Efficient Maximum Likelihood–Decoding Algorithm for Linear Block Codes with Algebraic Decoder", IEEE Transactions on Information Theory, vol. 40, No. 2, Mar. 1994, pp. 320–327.

(List continued on next page.)

Primary Examiner—Stephen M. Baker
Attorney, Agent, or Firm—Brinks Hofer Gilson & Lione

[57] ABSTRACT

In an error control device, an error correction decoding portion 33 selects a bit position which has low reliability from the received signal by means of a predetermined bit number, generates error patterns by assuming that the errors exist at the bit position, and carries out modified Chase decoding for the received signals on the basis of each error pattern in modified Chase decoding portion 332. Modified Chase decoding portion 332 calculates the reliability of each error pattern by using the reliability of each bit in the received signal.

4 Claims, 3 Drawing Sheets

OTHER PUBLICATIONS

Chase, D., A Class of Algorithms for Decoding Block Codes With Channel Measurement Information, IEEE Transactions on Information Theory, vol. IT–18, No. 1, Jan. 1972, pp. 170–182.

Lugand, L., et al., Parity Retransmission Hybrid ARQ Using Rate 1/2 Convolutional Codes on a Nonstationary Channel, IEEE Transactions on Communications, vol. 37, No. 7, Jul. 1989, pp. 755–765.

Ng, W–H., Adaptive ARQ Using Complementary Coding and Signal Editing, MILCOM '92, pp. 589–593.

Kaneko, T., et al., An Efficient Maximum–Likelihood–Decoding Algorithm For Linear Block Codes With Algebraic Decoder, IEEE Transactions on Information Theory, vol. 40, No. 2, Mar. 1994, pp. 320–327.

Mandelbaum, D., An Adaptive–Feedback Coding Scheme Using Incremental Redundancy, IEEE Transactions on Information Theory, May 1994, pp. 388–389.

Loeliger, H–A., A Practical Reliability Metric for Block Codes Used on Binary–Input Channels, IEEE Transactions on Communications, vol. 38, No. 4, Apr. 1990, pp. 405–408.

Aridhi, S., et al., Performance Analysis of Type–I and Type–II Hybrid ARQ Protocols using Concatenated Codes in a DS–CDMA Rayleigh fading Channel, 4th International Conference on Universal Personal Communications, pp. 748–752.

Chase, D., Code Combining—A Maximum–Likelihood Decoding Approach for Combining an Arbitrary Number of Noisy Packets, IEEE Transactions on Communications, vol. 33, No. 5, May 1985, pp. 385–393.

P. Decker, An Adaptive Type–II hybrid ARQ/FEC Protocol suitable for GSM, Proceedings of the Vehicular Technology Conference, Stockholm, vol. 1, No. 44, Jun. 1994, pp. 330–333.

Bakhtiyari, S. et al., A Robust Type II Hybrid ARQ Scheme With Code Combining For Mobile Communications, Proceedings of the Pacific Rim Conference on Communications, Computing, and Signal Processing, Victoria, vol. 1, May 1993, pp. 214–217.

S. Kallel, Complementary Punctured Convolutional (CPC) Codes and Their Applications, IEEE Transactions on Communications, vol. 43, No. 6, Jun. 1995, pp. 2005–2009.

Zhao, H., et al., A Hybrid ARQ Scheme for DS–CDMA Mobile Data Communications, 1996 5th IEEE International Conference on Universal Personal Communications Record, Oct. 2, 1996, pp. 71–75.

ERROR CONTROL METHOD AND ERROR CONTROL DEVICE FOR DIGITAL COMMUNICATION

BACKGROUND OF THE INVENTION

1. Field of the Invention

The present invention relates to an error control method and an error control device for digital communication which employ retransmission control such as ARQ (Automatic Repeat Request), and in particular relates to an error control method and an error control device for digital communication which use hybrid ARQ which carries out code combining.

2. Background

In conventional retransmission control using a code combining technique, all received signals are used in a decoding. The technique of retransmission control is disclosed, for example, in IEEE Trans. Commun. vol.33, pp,385–393, May, 1985. Retransmission control methods using code combining techniques are classified into methods which add only an error detecting code to the first signal transmitted without providing a redundancy for error correction, and methods which provide a redundancy for error correction to the first signal transmitted.

In retransmission control using the code combining technique, when signals having an extremely large number of errors are included in the received signals, multiple retransmission is necessary and all the received signals are used in the technique. Furthermore, in the method which adds an error detecting code only to the first transmitted signal without providing a redundancy for error correction, the first signal received can be decoded only if it is received error-free. However, if there is an error in even one bit, then this signal cannot be decoded. On the other hand, in the method which provides a redundancy for error correction to the first transmitted signal, the throughput is improved in the case where the transmission channel has a poor quality. However, in the case where the transmission channel has a sufficient quality, the throughput plateaus.

If Chase decoding is used on retransmission control using a code combining technique, it is possible to correct errors using only an error detecting code. However, many combinations must be calculated in order to carry out Chase decoding, such that the number of calculations becomes enormous. Because in the algorithm defined by Chase decoding, all test patterns are tested, the number of calculations is enormous. As illustrated in FIG. 3, in order to reduce the number of calculations, the Chase decoding algorithm is modified (we define it as modified Chase decoding) such that the trials start with the most reliable test pattern to the most unreliable test pattern and the trials are terminated upon the first successful binary decoding.

SUMMARY OF THE INVENTION

It is accordingly a primary object of the present invention to provide an error control method and an error control device for digital communication, that are able to decode with high efficiency, and are able to obtain a maximum throughput even if the transmission channel has a low quality.

In an aspect of the present invention, there is provided an error control method for digital communication which corrects errors which occur in the transmission of signals, the method characterized in having a receiving step for receiving said signals; a selecting step for selecting a portion of said signals which are received in said receiving step; and a decoding step for carrying out decoding using said portion of said signals which are selected in said selecting step.

Furthermore, in an aspect of the present invention, there is provided an error control device which corrects errors which occur in the transmission of signals, said error control device consisting of a receiving means for receiving said signals; a selecting means for selecting a portion of said signals which are received by said receiving means; and a decoding means for carrying out decoding using said portion of said signals which are selected by said selecting means.

Furthermore, in an aspect of the present invention, there is provided an error control device additionally having a bit position selecting means for selecting a predetermined number of bit positions where reliability is low from the received signal; a generating means for generating error patterns by assuming that said errors exist at some or all of said bit positions; and a decoding means for carrying modified Chase decoding on the received signal based on each error pattern which is generated by said generating means.

Furthermore, in an aspect of the present invention, there is provided an error control device, wherein said decoding means calculates the reliability of each error pattern by using the reliability of each bit in the received signal, and successively carries out modified Chase decoding on the received signals beginning with the error pattern having the highest reliability.

Furthermore, in an aspect of the present invention, there is provided an error control device additionally having a retransmission request means for requesting retransmission of said signals when said modified Chase decoding by said decoding means fails, and a repeating means for repeating procedures of said receiving means, said selecting means and said decoding means, wherein the selecting means consists of a first selecting means for selecting all signals which are received by said receiving means, and a second selecting means for successively selecting portions of the received signals in the order of highest to lowest capability to correct errors, from the plurality of signals which are received by said receiving means.

Furthermore, in an aspect of the present invention, there is provided an error control device, wherein said selecting means consists of a calculating means which calculates the reliability of each signal, wherein said second selecting means selects successively signal combinations in accordance with the reliabilities from said plurality of signals which are received by said receiving means.

Furthermore, in an aspect of the present invention, there is provided an error control device, wherein said decoding means carries out diversity decoding using said plurality of signals which are received by said receiving means when modified Chase decoding fails.

In addition, in an aspect of the present invention, there is provided an error control device, wherein said decoding means carries out Viterbi decoding using said plurality of signals which are received by said receiving means when modified Chase decoding fails.

Therefore, in an error control method and an error control device for digital communication, it is possible to decode with high efficiency even if the received signals contain a signal which has an extremely large number of errors because the decoding procedure is carried out using only a portion of the received signals. Furthermore, because the signal to be transmitted has the redundancy of only an error detection code, it is possible to obtain the maximum throughput when the transmission channel is of high quality.

Furthermore, due to modified Chase decoding, it is possible to correct errors and maintain high transmission quality effects even if the quality of the transmission channel deteriorates. In addition, it is possible to reduce the amount of signal operations on the receiving side by controlling the decoding order in modified Chase decoding.

BRIEF DESCRIPTION OF THE DRAWINGS

Further objects and advantages of the present invention will be apparent from the following description, reference being made to the accompanying drawings wherein preferred embodiments of the present invention are clearly shown.

In the drawings.

DESCRIPTION OF THE PREFERRED EMBODIMENTS

An explanation will now be made of preferred embodiments of the present invention with reference to figures.

Figure 1:
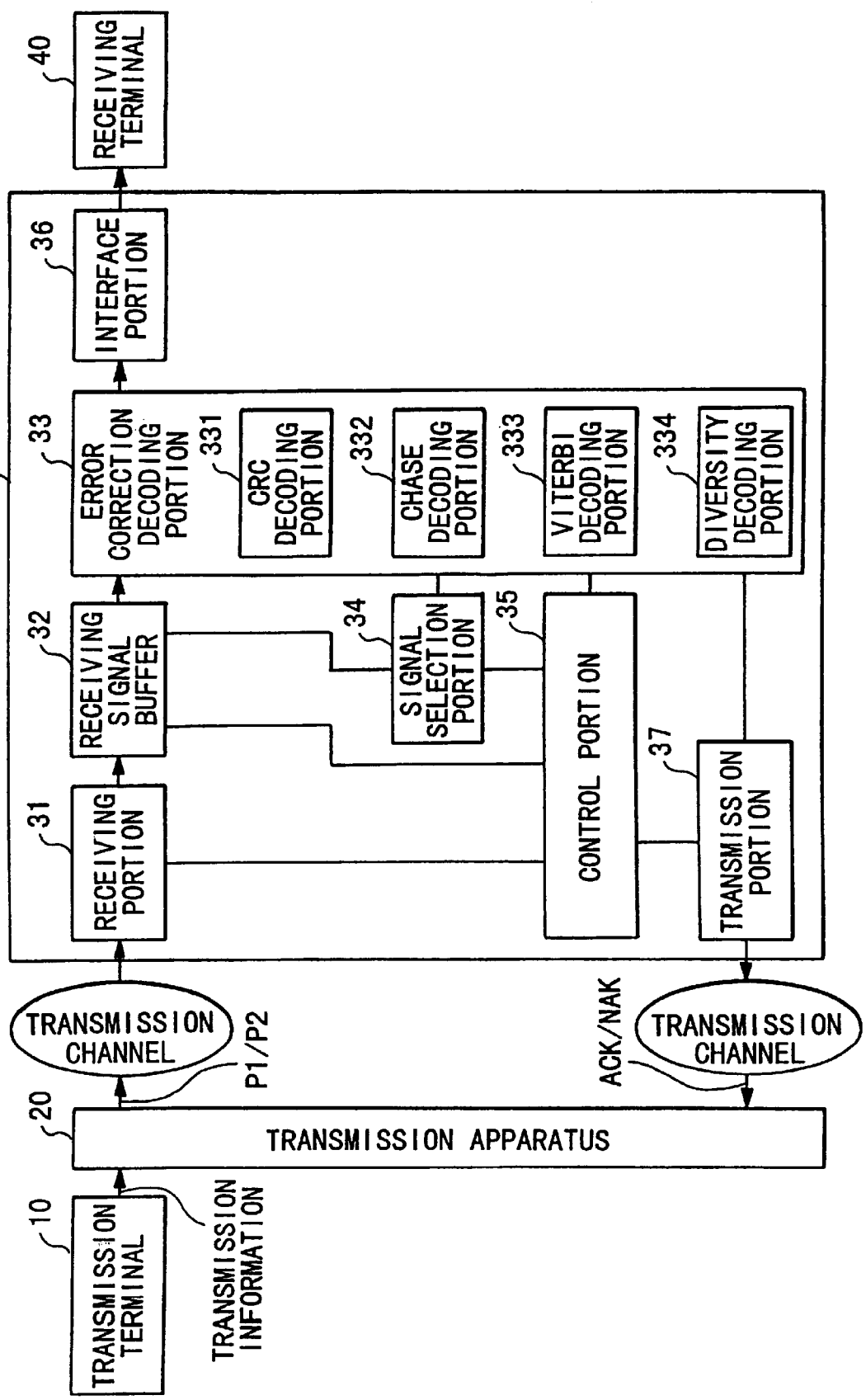
FIG. 1 is a block diagram showing a structural example of a receiving apparatus according to an embodiment of the present invention.

FIG. 1 is a block diagram showing a structural example of a receiving apparatus according to an embodiment of the present invention.

Figure 2:
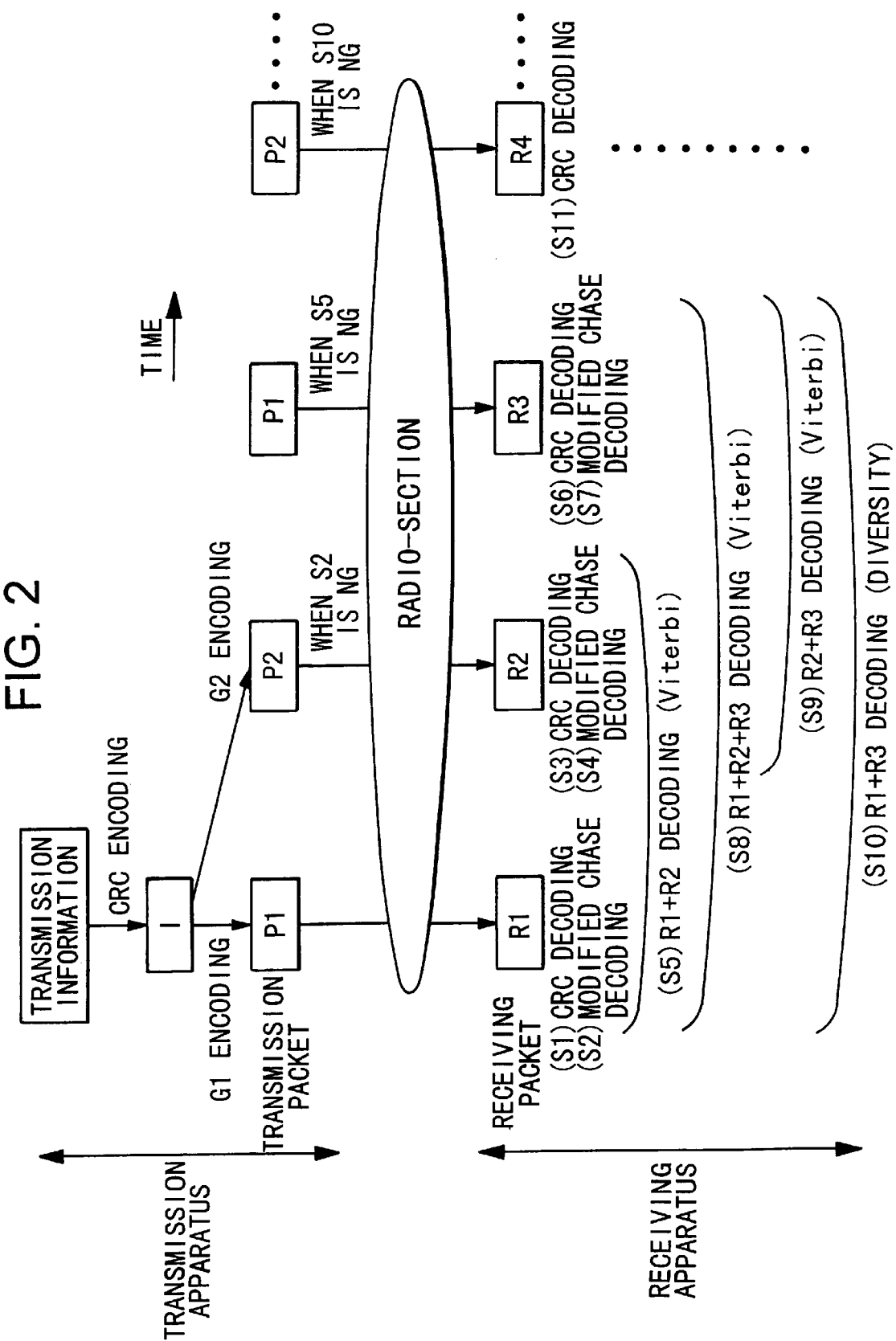
FIG. 2 is a chart diagram explaining the operation of a transmission apparatus and a receiving apparatus.

FIG. 2 is a chart diagram explaining the operation of a transmission apparatus and a receiving apparatus. Transmission apparatus 20 receives transmission information from transmission terminal 10, and then adds an error detecting code (CRC code) to the transmission information. A signal series with added CRC code is expressed as I. Next, transmission apparatus 20 carries out a convolutional encoding to the signal series including CRC bits at a rate of 1/2. The generator polynomials are expressed as (G1, G2). Furthermore, a signal encoded with G1 is expressed as P1, and a signal encoded with G2 is expressed as P2. Transmission apparatus 20 transmits the transmission signal P1 first.

Receiving apparatus 30 receives signal P1 in which errors are overlapped thereto on the transmission channel. The overlapping error pattern is expressed as E1, and the receiving signal is expressed as R1. Therefore, receiving signal R1 becomes a value (R1=P1+E1) which is sum of transmission signal P1 and a modulo-2 addition of error pattern E1. Receiver 31 of receiving apparatus 30 receives receiving signal R1, and then converts receiving signal R1 to a base band signal, and outputs the base band signal to receiving signal buffer 32. Control portion 35 detects receiving signal R1, and then instructs an execution of a CRC decoding procedure to error correction decoding portion 33. Error correction decoding portion 33 receives the base band signal from receiving buffer 32, and carries out CRC decoding in CRC decoding portion 331 (FIG. 2 (S1)). If CRC decoding portion 331 can decode the base band signal, receiving apparatus 30 outputs a decoded signal to receiving terminal 40 through interface portion 36, and transmits a receipt acknowledgment signal ACK to transmission apparatus 20 through transmission portion 37, completing the receiving procedure. On the other hand, if CRC decoding portion 331 cannot decode the base band signal because of errors, receiving apparatus 30 carries out modified Chase decoding by Chase decoding portion 332.

Figure 3:
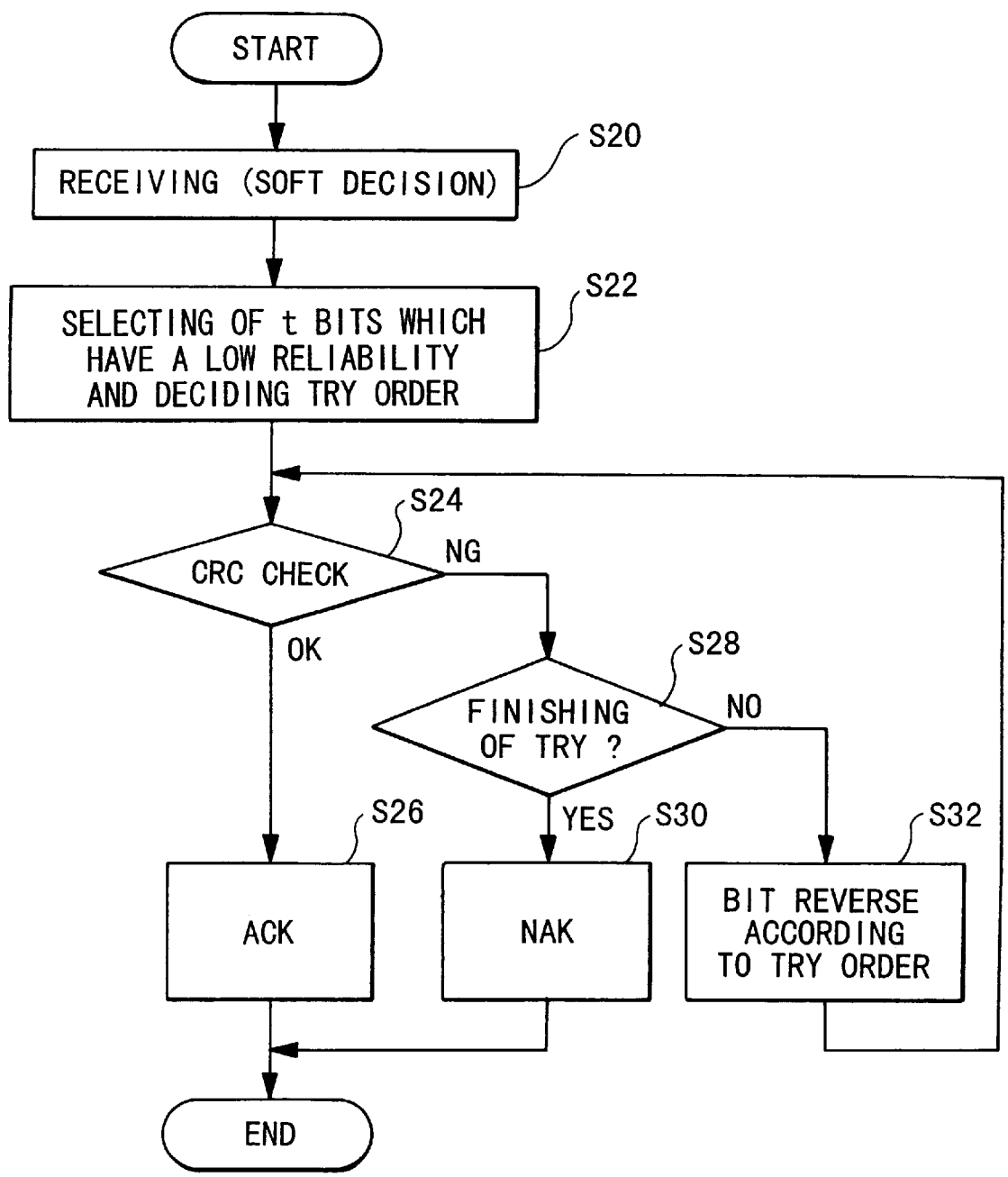
FIG. 3 is a flowchart showing the Chase modified decoding method of the present invention.

FIG. 3 is a flowchart showing the modified Chase decoding method of the present invention. Chase decoding portion 332 checks whether errors exist in the receiving signal or not (S20). When errors exist in the receiving signal, Chase decoding portion 332 searches the reliability of each bit of the receiving signal, and selects t bits which have the lowest degrees of reliability. It is assumed that errors were generated in all or a portion of these t bits, and that errors where not generated in the remainder of the bits. There are $2^t - 1$ (^^^expresses the power of the number) error patterns in t bits. Next, Chase decoding portion 332 calculates the sum of the reliabilities of the bits in which error is indicated by the error patterns, and carries out CRC decoding in the order that selects the untried pattern for which the sum of reliabilities is lowest (S22).

When CRC decoding is successful (S24), error correction decoding portion 33 completes the modified Chase decoding procedure. Next, when modified Chase decoding is completed, error correction decoding portion 33 transmits receipt acknowledgment signal ACK to transmission apparatus 20, and completes the receiving procedure (S26). On the other hand, when CRC decoding fails, error correction decoding portion 33 judges whether or not there is a combination which has not been tested (S28). Furthermore, when CRC decoding for all combinations fails, and all attempts are completed (S28), error correction decoding portion 33 transmits retransmission request signal NAK to transmission apparatus 20 (S30). On the other hand, when all attempts have not been completed, error correction decoding portion 33 generates the pattern of the next attempt by reversing the appropriate bits (S32), and returning to step S24.

When transmission apparatus 20 receives retransmission request signal NAK, it transmits transmission signal P2. Afterward, transmission apparatus 20 alternately transmits transmission signals P1 and P2 whenever it receives retransmission request signal NAK. When receiving apparatus 30 receives receiving signal R2 with the value equivalent to that obtained by adding transmission signal P2 and error pattern E2 (R2=P2+E2), CRC decoding portion 331 begins by carrying out CRC decoding (S3). At this time, if CRC decoding portion 331 cannot decode, then receiving apparatus 30 carries out modified Chase decoding by using modified Chase decoding portion 332 (S4). Furthermore, if modified Chase decoding by modified Chase decoding portion 332 also fails, receiving apparatus 30 carries out Viterbi decoding using R1 and R2 in Viterbi decoding portion 333 (S5). If Viterbi decoding by Viterbi decoding portion 333 fails, then receiving apparatus 30 transmits retransmission request signal NAK.

Next, receiving apparatus 30 receives receiving signal R3 with the value equivalent to that obtained by adding transmission signal P1 and error pattern E3 (R3=P1+E3), and carries out CRC decoding (S6). If CRC decoding fails, then receiving apparatus 30 carries out modified Chase decoding (S7). If modified Chase decoding also fails, receiving apparatus 30 carries out Viterbi decoding using R1, R2 and R3 (S8). If Viterbi decoding fails, then receiving apparatus 30 carries out Viterbi decoding using R2 and R3 (S9). If this decoding also fails, receiving apparatus 30 carries out diversity decoding in diversity decoding portion 334 (S10) using R1 and R3.

Modified Chase decoding is also used during diversity decoding. For example, when R1 and R3 are received, diversity decoding portion 334 obtains a signal RD which is decoded by diversity decoding on the basis of a selection diversity or maximum rate synthetic diversity for each bit of R1 and R3. Next, diversity decoding portion 334 carries out modified Chase decoding on signal RD.

If all decoding fails, then receiving apparatus 30 transmits retransmission request signal NAK. Then, receiving apparatus 30 carries out CRC decoding and modified Chase decoding whenever it receives a signal, and then carries out Viterbi decoding and diversity decoding when CRC and modified Chase decoding fails by combining the received signals in a predetermined order. Signal selecting portion 34 decides the combination of the received signals to be decoded.

Next, an explanation will be made of the combination order of the received signals when carrying out Viterbi decoding and diversity decoding. In this example, it is assumed that there are N number of received signal series R1, R2, . . . , Rn (n=2k); that the received signal series R1, R3, . . . , R2k−1 is the received signal when P1 is transmitted; and that received signal series R2, R4, . . . , R2k is the received signal when P2 is transmitted. In this example, it is also assumed that the reliability of received signal Rn is rn. The reliability rn can be expressed, for example, as the sum of the receiving levels of each bit in received signal Rn.

First, Viterbi decoding is carried out using all received signals. Next, Viterbi decoding is carried out using (N−1) received signals by excluding one received signal from the N received signals. There are N combinations for (N−1) number of signals. Thus, signal selecting portion 34 decides the selection order by using reliability rn. Signal selecting portion 34 selects (N−1) signals by sequentially excluding received signals Rn starting with the signal which has the smallest reliability rn. However, it is also possible for signal selecting portion 34 to select (N−1) signals by sequentially excluding signals beginning with the oldest received signals.

When Viterbi decoding using all combinations of (N−1) signals fails, Viterbi decoding is carried out using (N−2) signals. First, (N−2) signals are selected by excluding the two signals which have the smallest reliability rn. Then, rn+rn' (1=<n, n'=<N, n<n') is calculated, and (N−2) signals are selected by excluding signals Rn and Rn' in the order of smallest rn+rn', and Viterbi decoding is carried out using the selected signals.

Additionally, it is noted here that the reliability may also be calculated for all the signal combinations. For example, the reliability of received signal Ra×Rb×Rc× . . . ×Rx is ra+rb+rc+ . . . +rx. In this case, the reliabilities for all signal combinations are calculated, and then Viterbi decoding is carried out by sequentially selecting combinations in the order of highest to lowest capability to correct errors.

Then, diversity decoding is carried out on the received signal which corresponds to P1 in the selected combination. Next, diversity decoding is carried out on the received signal which corresponds to P2. Finally, Viterbi decoding is carried out by using the two signals which are obtained by each diversity decoding.

Other Embodiment

In this example, the number of received signals which correspond to P1 is n1, and the number of received signals which correspond to P2 is n2. If n1 is larger than n2 (n1>n2), diversity decoding is carried out for (n1−n2+1) signals having highest reliability from among the received signals which correspond to P1. When this signal and the received signals which corresponds to the remaining P1 are combined, signals which corresponds to n2 number of P1 are obtained. As a result, Viterbi decoding can be carried out using a total 2×n2 number of signals.

This invention may be practiced or embodied in still other ways without departing from the spirit or essential character thereof. Therefore, the preferred embodiments described herein are illustrative and not restrictive, the scope of the invention being indicated by the appended claims and all variations which come within the meaning of the claims are intended to be embraced therein.

What is claimed is:

1. An error control device which corrects errors which occur in the transmission of signals, comprising:
   (a) means for receiving, for receiving a plurality of signals;
   (b) means for selecting, for successively selecting a portion of said plurality of signals in an order of highest to lowest reliability;
   (c) means for decoding, for decoding using said portion of said plurality of signals, the means for decoding comprising:
      (1) means for selecting a bit position, for selecting a predetermined number of bit positions from a received signal having a low degree of reliability;
      (2) means for generating error patterns, for generating error patterns by assuming that errors exist at some or all of said bit positions; and
      (3) means for decoding, for decoding the received signal on the basis of test patterns formed using each of said error patterns; and
   (d) means for repeating procedures, for repeating procedures of said means for receiving, said means for selecting, and said means for decoding, when said decoding by said means for decoding fails,
   wherein:
      said means for decoding carries out a modified Chase decoding which decodes the received signal by starting trials from the most reliable test pattern and proceeding toward the most unreliable test pattern and the trials are terminated upon the first successful test pattern, and
      when said modified Chase decoding fails, said decoding means carries out diversity decoding using said plurality of signals.

2. An error control device which corrects errors which occur in the transmission of signals, comprising:
   (a) means for receiving, for receiving a plurality of signals;
   (b) means for selecting, for successively selecting a portion of said plurality of signals in an order of highest to lowest reliability;
   (c) means for decoding, for decoding using said portion of said plurality of signals, the means for decoding comprising:
      (1) means for selecting a bit position, for selecting a predetermined number of bit positions from a received signal having a low degree of reliability;
      (2) means for generating error patterns, for generating error patterns by assuming that errors exist at some or all of said bit positions; and
      (3) means for decoding, for decoding the received signal on the basis of test patterns formed using each of said error patterns; and
   (d) means for repeating procedures, for repeating procedures of said means for receiving, said means for selecting, and said means for decoding, when said decoding by said means for decoding fails, wherein:

said means for decoding carries out a modified Chase decoding which decodes the received signal by starting trials from the most reliable test pattern and proceeding toward the most unreliable test pattern and the trials are terminated upon the first successful test pattern, and when said modified Chase decoding fails, said decoding means carries out Viterbi decoding using said plurality of signals.

3. An error control method for digital communication which corrects errors which occur in the transmission of signals, comprising:

(a) a receiving step for receiving a plurality of signals;

(b) a selecting step for successively selecting a portion of said plurality of signals in an order of highest to lowest reliability;

(c) a decoding step for decoding using said portion of said plurality of signals, the decoding step comprising:
  (1) selecting a predetermined number of bit positions from a received signal having the lowest degree of reliability;
  (2) generating error patterns by assuming that errors exist at some or all of said bit positions; and
  (3) decoding the received signal on the basis of each of said error patterns; and (d) a repeating step for repeating procedures of said receiving step, said selecting step, and said decoding step, when said decoding by said decoding step fails, wherein:

said decoding step comprises carrying out a modified Chase decoding which decodes the received signal by starting trials from the most reliable test pattern and proceeding toward the most unreliable test pattern, and terminating the trials upon the first successful test pattern, and when said modified Chase decoding fails, carrying out diversity decoding using said plurality of signals.

4. An error control method for digital communication which corrects errors which occur in the transmission of signals, comprising:

(a) a receiving step for receiving a plurality of signals;

(b) a selecting step for successively selecting a portion of said plurality of signals in an order of highest to lowest reliability;

(c) a decoding step for decoding using said portion of said plurality of signals, the decoding step comprising:
  (1) selecting a predetermined number of bit positions from a received signal having the lowest degree of reliability;
  (2) generating error patterns by assuming that errors exist at some or all of said bit positions; and
  (3) decoding the received signal on the basis of each of said error patterns; and (d) a repeating step for repeating procedures of said receiving step, said selecting step, and said decoding step, when said decoding by said decoding step fails, wherein:

said decoding step comprises carrying out a modified Chase decoding which decodes the received signal by starting trials from the most reliable test pattern and proceeding toward the most unreliable test pattern, and terminating the trials upon the first successful test pattern, and when said modified Chase decoding fails, carrying out Viterbi decoding using said plurality of signals.

* * * * *

UNITED STATES PATENT AND TRADEMARK OFFICE
CERTIFICATE OF CORRECTION

PATENT NO. : 6,134,694
DATED : October 17, 2000
INVENTOR(S) : Shinji Uebayashi et al.

It is certified that error appears in the above-identified patent and that said Letters Patent is hereby corrected as shown below:

<u>Title page,</u>
Under "OTHER PUBLICATIONS", lines 1 to 25 should be deleted.

Signed and Sealed this

Twenty-ninth Day of January, 2002

Attest:

JAMES E. ROGAN
*Attesting Officer*  *Director of the United States Patent and Trademark Office*